(12) United States Patent
Gu et al.

(10) Patent No.: US 8,778,761 B2
(45) Date of Patent: Jul. 15, 2014

(54) METHOD OF MANUFACTURING SEMICONDUCTOR DEVICE

(71) Applicant: Grace Semiconductor Manufacturing Corporation, Shanghai (CN)

(72) Inventors: Jing Gu, Shanghai (CN); Binghan Li, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 13/914,244

(22) Filed: Jun. 10, 2013

(65) Prior Publication Data

US 2013/0330894 A1     Dec. 12, 2013

(30) Foreign Application Priority Data

Jun. 11, 2012   (CN) .......................... 2012 1 0191226

(51) Int. Cl.
  *H01L 27/115* (2006.01)
  *H01L 29/66* (2006.01)
(52) U.S. Cl.
  CPC ............................... *H01L 29/66825* (2013.01)
  USPC .............. 438/264; 257/E21.68; 257/E21.422; 257/E27.103
(58) Field of Classification Search
  None
  See application file for complete search history.

(56) References Cited

U.S. PATENT DOCUMENTS

2008/0026528 A1*   1/2008   Yuan et al. .................... 438/264
2012/0142153 A1*   6/2012   Jeong ............................ 438/264

* cited by examiner

*Primary Examiner* — Charles Garber
*Assistant Examiner* — Alia Sabur
(74) *Attorney, Agent, or Firm* — Muncy, Geissler, Olds & Lowe, P.C.

(57) ABSTRACT

A semiconductor device fabrication method particularly suitable for the fabrication of a 90 nm embedded flash memory is disclosed. The method includes: forming a dielectric layer having a first thickness over a first device region and forming a dielectric layer having a second thickness different from the first thickness over a second device region, the dielectric layer having a first thickness serving as a tunnel oxide layer of a split-gate structure, the dielectric layer having a second thickness serving as a gate oxide layer of a MOS transistor. The method enables the fabrication of a MOS transistor including a gate oxide layer with a desired thickness.

14 Claims, 10 Drawing Sheets

US 8,778,761 B2

METHOD OF MANUFACTURING SEMICONDUCTOR DEVICE

CROSS-REFERENCES TO RELATED APPLICATIONS

This application claims the priority of Chinese patent application number 201210191226.5, filed on Jun. 11, 2012, the entire contents of which are incorporated herein by reference.

TECHNICAL FIELD

The present invention relates in general to the fabrication of semiconductor devices, and more particularly, to a method of manufacturing a semiconductor device including a split-gate structure and a metal oxide semiconductor (MOS) transistor. The method is particularly suitable for use in the fabrication of a 90 nm embedded flash memory.

BACKGROUND

Flash memories have been focused in researches for non-volatile memory devices due to their advantages such as convenience to use, high storage density, and excellent reliability. Since the debut of the first flash memory in 1980s, flash memories have been widely used in cell phones, laptop computers, palm-sized computers, USB flash disks and other portable and communication devices, accompanying with technological development and increasing needs for good storage devices for various electronic products. As a kind of persistent storage device, a flash memory stores information by changing threshold voltages of transistors or memory cells so as to switch on or off the gate electrode channels to prevent the stored information from being lost due to failure of power supply. Flash memories are a special variety of electrically erasable programmable read-only memory devices, which currently take a dominant share and grow fastest in the market of non-volatile semiconductor memory devices.

Whereas, due to the limitation in programming voltage, it is a great challenge to increase the existing storage density of flash memories by size shrinkage. Therefore, developing a flash memory with a high storage density is currently an important motivation for technological development in this field. However, in this regard, limited by the structure of conventional flash memories, reducing the programming voltage, which is required for increasing the storage density, is difficult to achieve. In general, a flash memory device includes a split-gate structure, a stacked-gate structure, or a combination of the above two. When comparing the two structures, the split-gate structure has advantages in both programming and erasing performance because of a special configuration. And it has a higher programming efficiency, an advanced word-line arrangement which can avoid the "over-erasure" and other advantages. For these reasons, split-gate structures have wider applications. On the other hand, as a split-gate structure adopts an additional word line than a stacked-gate structure, it generally leads to a greater chip size. This is unfavorable for producing a semiconductor memory device with densely packed memory cells and thus a high storage intensity which encourages the storage circuit layout to be designed as small as practicable. Therefore, in order to enable memory cells to be packed in a high density, there is a need for improving the structure of the existing semiconductor memory device.

In addition, as each hit in memory arrays connects to a contact metal wire, rather densely arranged metal wires are typically formed in wafer in the manufacturing of the semiconductor memory device. Increasing the density of memory cells further raises the density of the metal wires and thus adds manufacturing difficulties because it requires extremely fine lines to be formed in relevant masking and etching processes. Therefore, the method of increasing memory cell density by forming more memory cells in the wafer imposes critical requirements on manufacturing processes, which limits its applications.

SUMMARY OF THE INVENTION

The present disclosure addresses the drawback of the prior art by presenting a method of manufacturing a semiconductor device. The method can effectively reduce chip size and eliminate the issue of "over-erasure" while maintaining the existing in-chip electrical isolation performance. Additionally, the method can increase the memory array density of a memory device and prepare pick-up electrodes with ensured quality for both the memory device and other semiconductor devices. Moreover, the method can be effectively used in the manufacturing of a semiconductor device incorporating a split-gate structure and a MOS transistor which includes a desired thickness of gate oxide.

To achieve these objectives, the present invention provides a method of manufacturing a semiconductor device which includes a split-gate structure and a MOS transistor. The method includes the steps of: 1) providing a semiconductor substrate including a first device region and a second device region; 2) sequentially forming a first dielectric layer, a first conductive layer, a second dielectric layer, a second conductive layer, and a first etch stop layer over the semiconductor substrate; 3) forming a first window in the first etch stop layer in the first device region, removing a portion of the first etch stop layer that covers the second device region and forming a first isolation sidewall over each side face of the etched first etch stop layer; 4) firming a first trench in the first device region by performing an etching process using the first etch stop layer and the first isolation sidewalls as a mask until surface of the semiconductor substrate is exposed; 5) depositing a third isolation dielectric layer and a third conductive layer over the resulting structure after the step 4); 6) removing a portion of each of the third isolation dielectric layer and the third conductive layer that covers the second device region; 7) sequentially depositing an additional conductive layer and an additional isolation dielectric layer over the resulting structure after the step 6); 8) sequentially depositing a second etch stop layer and a third etch stop layer over the resulting structure after the step 7); 9) removing a portion of each of the third etch stop layer, the second etch stop layer, the additional conductive layer and the additional isolation dielectric layer that covers the first device region, followed by a planarization process for exposing the first etch stop layer; 10) depositing a fourth etch stop layer over a surface of the third conductive layer filled in the first trench and removing the first and third etch stop layers using the fourth etch stop layer as a mask; II) performing an etching process in the first device region using the fourth etch stop layer as a mask until a surface of the semiconductor substrate is exposed; and 12) removing undesirable portions of each of the additional conductive layer and the additional isolation dielectric layer in the second device region to form an electrode for connecting to an external power supply.

Preferably, the third isolation dielectric layer in the first device region can have a thickness different from a thickness of the additional isolation dielectric layer in the second device region.

Preferably, the step 2) may include a process of forming a shallow trench isolation (STI) structure. The process may include the steps of 201) sequentially forming a first dielectric layer, a first conductive layer and an STI etch stop layer over the semiconductor substrate; 202) forming a second window in the STI etch stop layer and form an STI trench by sequentially etching, in the second window, the first conductive layer, the first dielectric layer and a portion of the semiconductor substrate; 203) forming an STI structure by filling an insulating material in the STI trench and removing the STI etch stop layer and undesirable portions of the insulating material; and 204) forming a second dielectric layer, a second conductive layer and a first etch stop layer over the resulting structure after the step 203).

Preferably, the step 4) may include the steps of: 401) etching the second conductive layer and the second dielectric layer until the first conductive layer is exposed; 402) forming second isolation sidewalls covering side faces of the etched second conductive and the second dielectric layers; and 403) etching the first conductive layer and the first dielectric layer until the semiconductor substrate is exposed.

Preferably, the first dielectric layer may serve as a gate oxide layer and has a thickness of 50 Å to 200 Å.

Preferably, the second dielectric layer and the second isolation sidewalls may be insulating dielectric layers each comprised of one or more dielectric materials selected from the group consisting of silicon dioxide, silicon nitride, silicon oxynitride and silicon oxide containing carbon. The second dielectric layer may have a thickness of 50 Å to 350 Å, and each of the second isolation sidewalls has a width of 50 Å to 350 Å in a length direction of the first trench.

Preferably, the third isolation dielectric layer may serve as a tunnel oxide layer comprised of silicon oxide, silicon nitride or a combination of thereof, and the third isolation dielectric layer has a width of 50 Å to 200 Å in a length direction of the first trench and a thickness of 80 Å to 150 Å.

Preferably, the first conductive layer may be comprised of polysilicon, silicon nitride or an electrically conductive nanocrystalline material. In addition, the second conductive layer may be comprised of polysilicon or a metal and the third conductive layer may be comprised of polysilicon or a metal.

Preferably, the first and third etch stop layers may be comprised of silicon nitride.

Preferably, the first isolation sidewalls and the second and fourth etch stop layers may be comprised of silicon dioxide.

Preferably, the third conductive layer in the first trench may serve as a gate of a memory cell, and remaining portions of the first conductive layer and remaining portions of the second conductive layer after the step 9) may respectively serve as floating gates and control gates of the memory cell.

Preferably, the split-gate structure may be formed in the first device region and the MOS transistor may be formed in the second device region.

Every two bit cells of a semiconductor device constructed in accordance with the method discussed above co-share a single word line, thereby enabling performing programming activities, including reading, erasing and those performed by hot electron injection, to the bit cells by applying different operating voltages to the word line, two control gates and source/drain regions of the semiconductor device. The word line co-share configuration enables a split-gate type flash memory device to effectively reduce chip size and eliminate the issue of "over-erasure" while maintaining the existing chip electrical isolation performance. Moreover, the method is able to form pick-up electrodes for other semiconductor devices of the same chip without damaging or affecting pick-up electrodes of the memory device and without needing any additional processes or increasing process complexity. Furthermore, the method can be effectively used in the manufacturing of a semiconductor device incorporating a split-gate structure and a MOS transistor which includes a desired thickness of gate oxide.

BRIEF DESCRIPTION OF THE DRAWINGS

The present invention and its advantages and features will become more easily and fully understood from the following detailed description, taken in conjunction with the accompanying drawings, in which.

It should be understood that the drawings are for illustrative purposes and are not intended to limit the scope of the present invention. It is noted that the drawings may not be drawn to scale and corresponding reference numerals indicate like or corresponding elements throughout the drawings.

DETAILED DESCRIPTION

Exemplary embodiments are described in detail below in conjunction with the accompanying drawings so that this disclosure will be thorough and easily understood.

A method of manufacturing a memory device in accordance with preferred embodiments will be described in detail with reference to the accompanying drawings.

Figure 1:
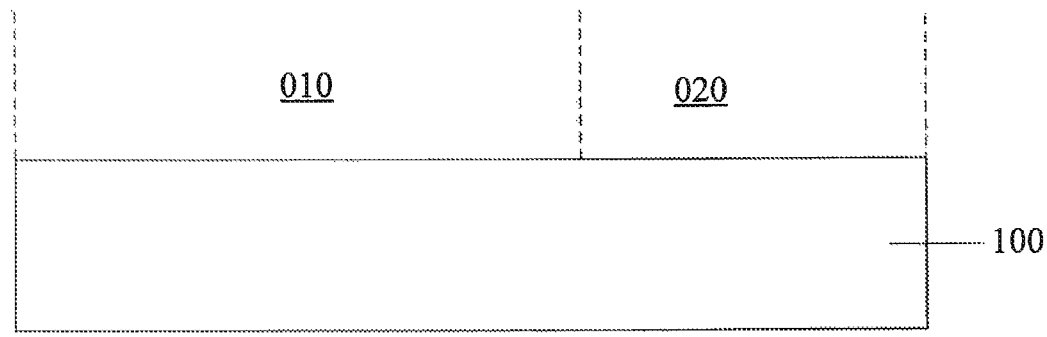
FIGS. 1 to 19 are cross-sectional views of device structures after steps of a method of manufacturing a memory device in accordance with preferred embodiments of the present invention.

Turning now to FIG. 1, in a first step of the method, a semiconductor substrate 100 is provided. The semiconductor substrate 100 may typically be a silicon substrate or a silicon-on-insulator (SOI) substrate. The semiconductor substrate 100 includes a first device region 010 and a second device region 020.

Next, in a second step, a first dielectric layer 101, a first conductive layer 110, a second dielectric layer 102, a second conductive layer 120 and a first etch stop layer 111 are sequentially formed over the semiconductor substrate 100 in this order.

The first dielectric layer 101 may be a gate oxide layer typically comprised of silicon dioxide or silicon oxynitride. For a device with a further smaller feature size, a material with a higher dielectric constant such as hafnium oxide, zirconium oxide and aluminum oxide may be preferably selected to form the first dielectric layer 101 in order to reduce the drain current of the device. The first dielectric layer 101 may be formed by chemical vapor deposition (CVD), plasma-enhanced chemical vapor deposition (PECVD), or thermal oxidation. The first dielectric layer 101 may have a thickness of 50 Å to 200 Å, or preferably, of 80 Å to 150 Å.

The first conductive layer 110 may serve as floating gates FG of the memory device being fabricated. The first conductive layer 110 may be comprised of polysilicon, silicon nitride or an electrically conductive nanocrystalline material. In some specific embodiments, in order for better electrical performance, polysilicon that forms the first conductive layer 110 is doped with a dopant, for example, the N-type phosphorus or the P-type boron. The first conductive layer 110 may be deposited by CND, physical vapor deposition (PVD), or PECVD. The first conductive layer 110 may have a thickness of 100 Å to 500 Å, or more preferably, of 200 Å to 400 Å.

The second dielectric layer 102 may be an insulating intermediate dielectric layer comprised of one or more dielectric materials selected from the group consisting of silicon dioxide, silicon nitride, silicon oxynitride and silicon oxide containing carbon. The second dielectric layer 102 may be deposited by CVD and have a thickness of 50 Å to 350 Å, or more preferably, of 100 Å to 300 Å.

The second conductive layer 120 may serve as control gates CG of the memory device being fabricated. The second conductive layer 120 may be comprised of polysilicon or a metal, and the polysilicon may be doped, preferably, with a dopant having the same conductivity type with that of the semiconductor substrate 100. The second dielectric layer 102 may be deposited by CVD and have a thickness of 600 Å to 1700 Å, or more preferably, of 800 Å to 1500 Å.

Figure 2:
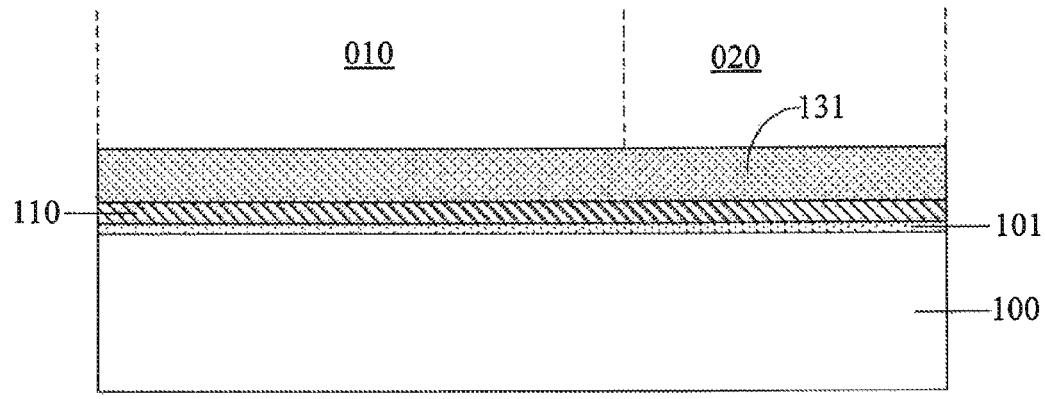
Figure 3:
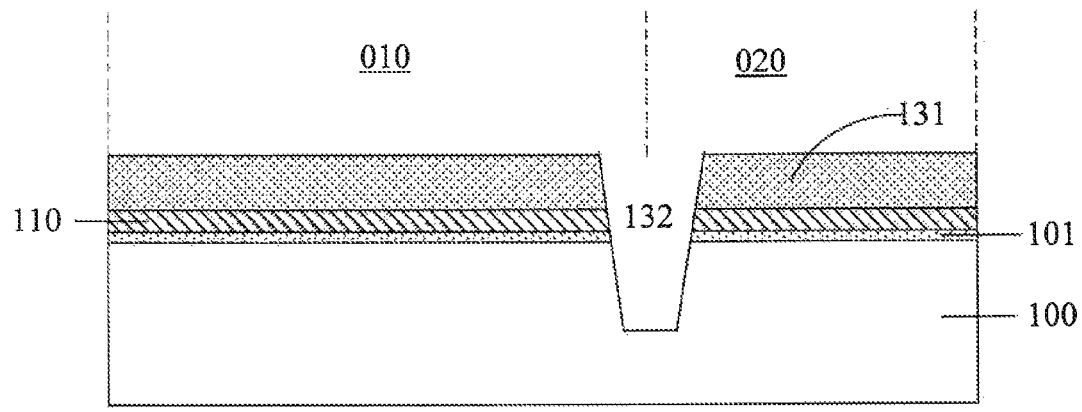
Figure 4:
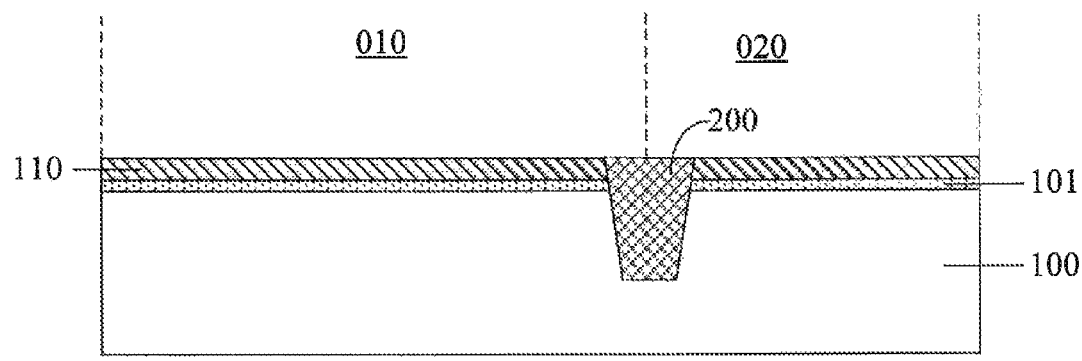
Figure 5:
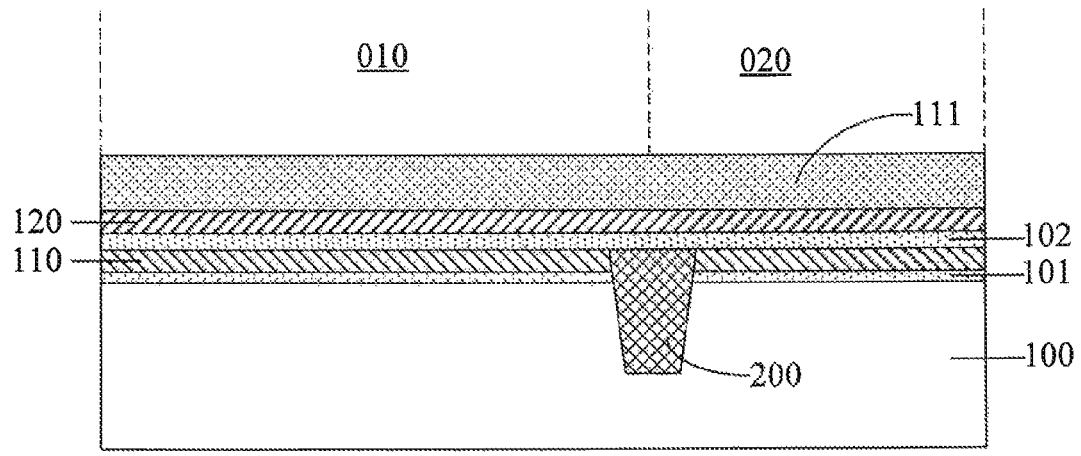

The second step may preferably include a process of forming a shallow trench isolation (STI) structure (or referred to as an active area isolation structure) 200 in the semiconductor substrate 100. In some specific embodiments, the process includes the steps of:

sequentially forming the first dielectric layer 101, the first conductive layer and an STI etch stop layer 131 over the semiconductor substrate 100, as shown in FIG. 2, wherein the STI etch stop layer 131 may serve as a mask for protecting the underlying other layers in the first and second device regions 010, 020 from possible damages during the process of forming the STI structure 200, wherein the STI etch stop layer 131 may be comprised of one or more dielectric materials selected from the group consisting of silicon dioxide, silicon nitride, silicon oxynitride and silicon oxide containing carbon, and wherein the STI etch stop layer 131 may be formed by CVD;

forming a window in the STI etch stop layer 131 and thereafter forming an STI trench 132 by etching, in the window, the first conductive layer 110, the first dielectric layer 101 and a portion of the semiconductor substrate 100, as shown in FIG. 3;

filling an insulating material in the STI trench 132 and removing the STI etch stop layer 131 and undesirable portions of the insulating material to form the STI structure 200, as shown in FIG. 4; and forming the second dielectric layer 102, the second conductive layer 120 and the first etch stop layer 111 over the resulting structure after the previous step of this process, as shown in FIG. 5, wherein the first etch stop layer 111 may serve as a mask for protecting the underlying other layers from possible damages during the subsequent steps as discussed in detail below, wherein the first etch stop layer 111 may be comprised of one or more dielectric materials selected from the group consisting of silicon dioxide, silicon nitride, silicon oxynitride and silicon oxide containing carbon, wherein the first etch stop layer 111 may be formed by CVD; and wherein the first etch stop layer 111 may have a thickness of 1500 Å to 6000 Å, or more preferably, of 3000 Å to 5000 Å.

Figure 6:
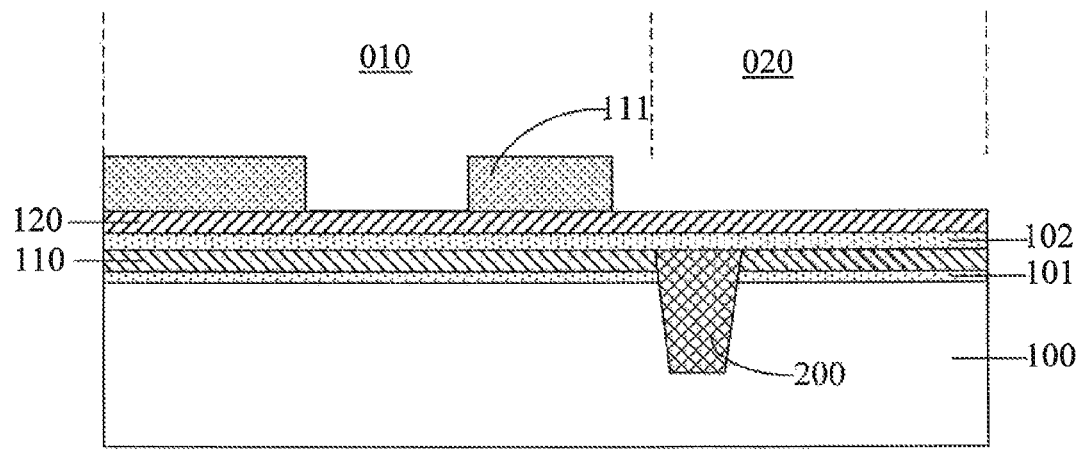
Figure 7:
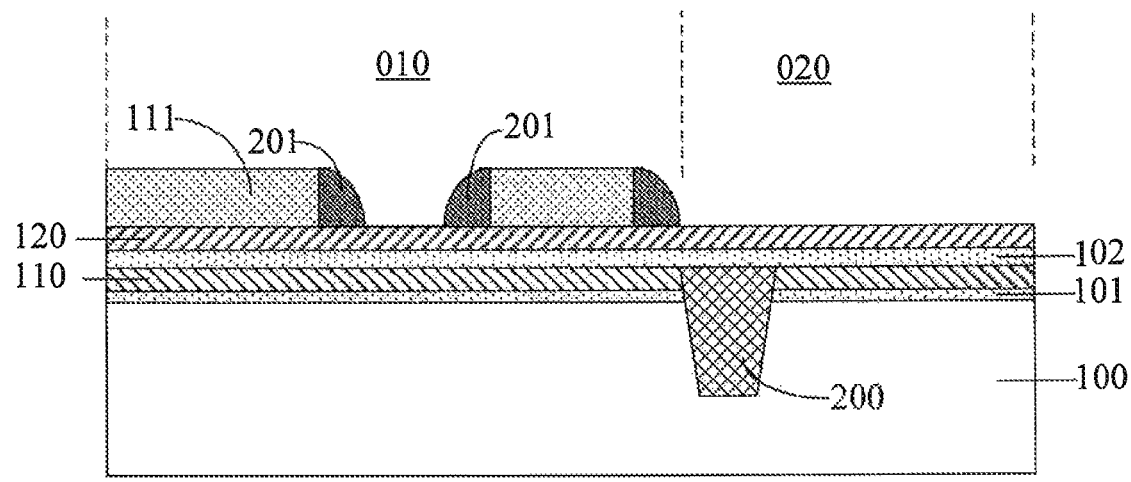

Turning now to FIG. 6, in a third step of the method, another window is formed in the first etch stop layer 111 in the first device region 010. Additionally, the portion of the first etch stop layer 111 that covers the second device region 020 is removed. Moreover, referring to FIG. 7, a first isolation sidewall 201 is formed over each side face of the etched first etch stop layer 111.

This step may be done using any appropriate existing technique known to those skilled in the art, for example, a process including the following steps: spin-coating a photoresist layer over the first etch stop layer 111; removing a predetermined portion of the photoresist layer by exposure and development, thereby forming an opening therein; transferring the pattern of the opening to the first etch stop layer 111 by etching the first etch stop layer 111 using the photoresist layer as a mask; and removing the photoresist layer.

Each first isolation sidewall 201 may have an arc-like outer profile. The first isolation sidewalls 201 may be formed using a process similar to the existing sidewall forming processes. The process may include: depositing a first isolation dielectric material in the window; and removing a portion of the first isolation dielectric material in a central area of the window using a chemical etching and physical bombardment aided plasma etching process. The first isolation sidewalls 201 may be comprised of silicon dioxide.

Figure 8:
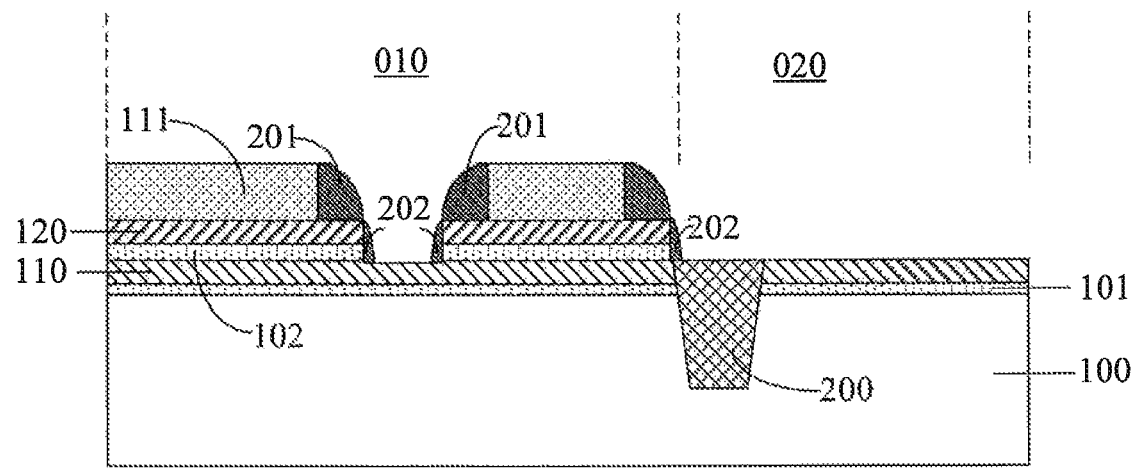

In a fourth step, a first trench 210 is formed through layers above the first dielectric layer 101 by performing an etching process using the first etch stop layer and the first isolation sidewalls as a mask until a surface of the underlying first dielectric layer 101 is exposed. Specifically, this step may include: etching the second conductive layer 120 and the second dielectric layer 102 until the first conductive layer 110 is exposed; forming second isolation sidewalls 202 over side faces of both the etched second conductive layer 120 and the second dielectric layer 102, as shown in FIG. 8; and etching the first conductive layer 110 and the first dielectric layer 101 until the underlying semiconductor substrate 100 is exposed.

Figure 9:
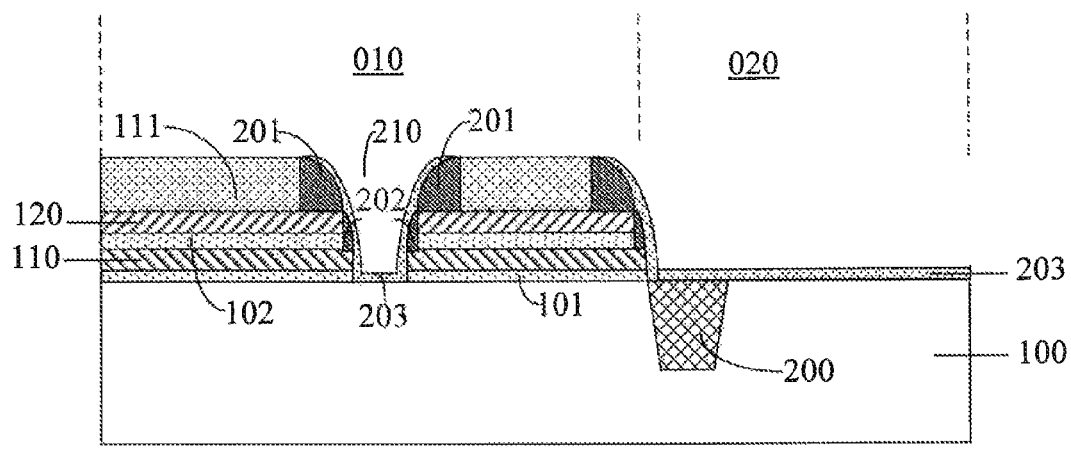

Next, forming a third isolation dielectric layer 203, covering side faces of the first conductive layer 110, side faces of the first dielectric layer 101, the first isolation sidewalls 201, the second isolation sidewalls 202 and the exposed portion of the semiconductor substrate 100, as shown in FIG. 9.

The third isolation dielectric layer 203 may serve as a tunnel oxide layer to separate a third conductive layer 130 formed in a subsequent step discussed below from the first conductive layer 110 and to enable programming activities such as reading and writing. The third isolation dielectric layer 203 may be comprised of silicon oxide, silicon nitride or a combination thereof. Moreover, the third isolation dielectric layer 203 may have a width of 50 Å to 200 Å in a length direction of the trench and a thickness of 80 Å to 150 Å, respectively, or more preferably, have a width of 50 Å to 200 Å and a thickness of 80 Å to 150 Å, respectively. The etching process in this step may be a plasma dry-etch process, a reactive-ion etching process, or a wet etching process. Furthermore, as known to those skilled in the art, in the etching process, different etchants may be selected for etching different dielectric materials.

Figure 10:
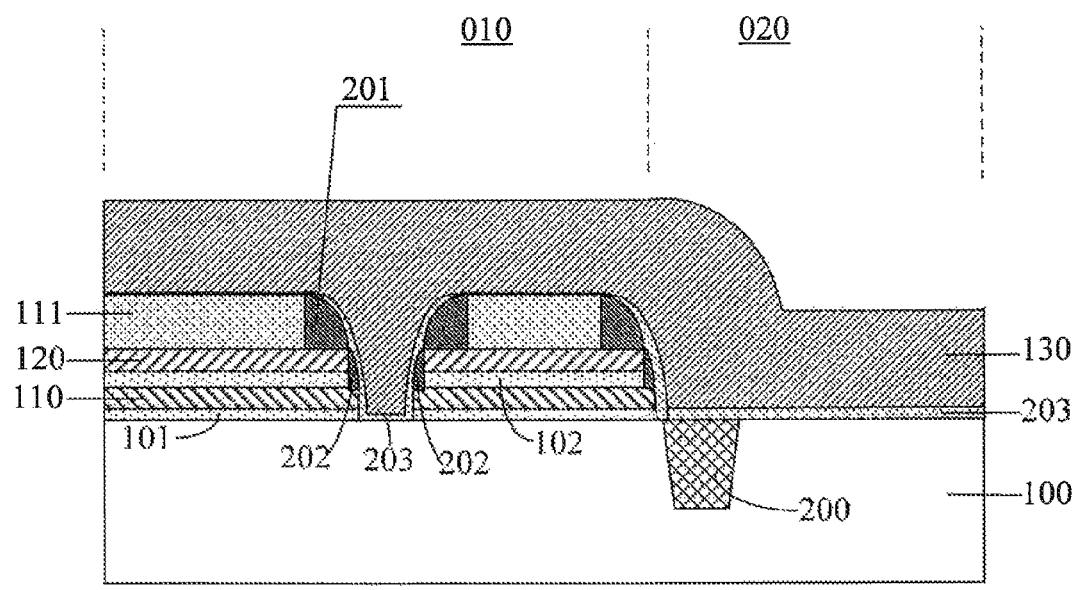

Referring to FIG. 10, in a fifth step of the method, a third conductive layer 130 is formed over the resulting structure after the fourth step. The third conductive layer 130 may be formed by CVD with polysilicon or a metal.

Figure 11:
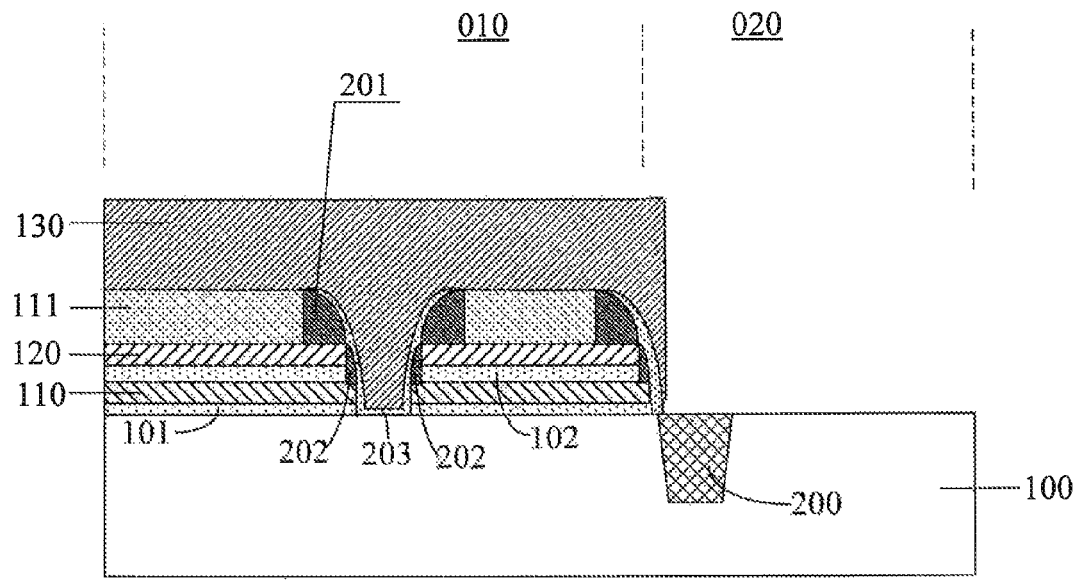
Figure 12:
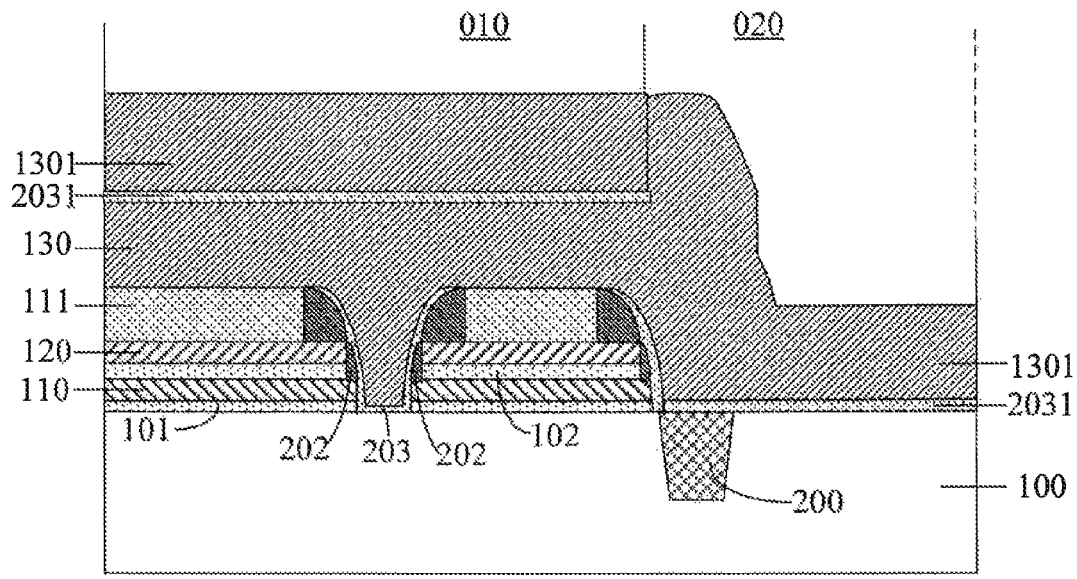

Next, in a sixth step, the portion of each of the third conductive layer 130 and the third isolation dielectric layer 203 that covers the second device region 020 is removed, as shown FIG. 11.

After that, in a seventh step, an additional isolation dielectric layer 2031 and an additional conductive material 1301 are sequentially deposited over the resulting structure after the sixth step. Each of the additional isolation dielectric layer 2031 and the additional conductive material 1301 covers both the first and second device regions 010, 020.

It is noted that the sixth and seventh steps can be used to substitute the third isolation dielectric layer 203 in the second device region 020 with the additional isolation dielectric layer 2031 that has a thickness effectively controllable during the formation of the additional isolation dielectric layer 2031. As the additional isolation dielectric layer 2031 in the second device region 020 may serve as a gate oxide layer for a MOS transistor (which is a regular MOS transistor) formed in a subsequent step discussed below, the thickness of the gate oxide layer can be determined and adjusted in the sixth and seventh steps, thereby contributing to the formation of a MOS transistor with a desired thickness of gate oxide without influencing the fabrication of a split-gate structure.

Figure 13:
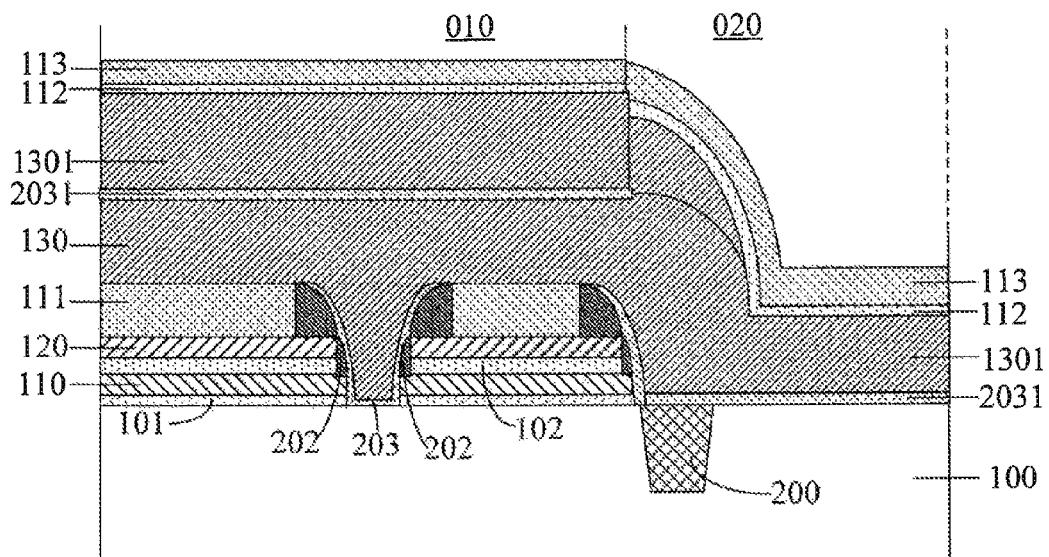

In an eighth step of the method, a second etch stop layer 112 and a third etch stop layer 113 are sequentially deposited over the resulting structure after the seventh step. Referring to FIG. 13, the third etch stop layer 113 may be comprised of silicon nitride and may have a thickness of 300 Å to 500 Å, or more preferably, of 400 Å.

Figure 14:
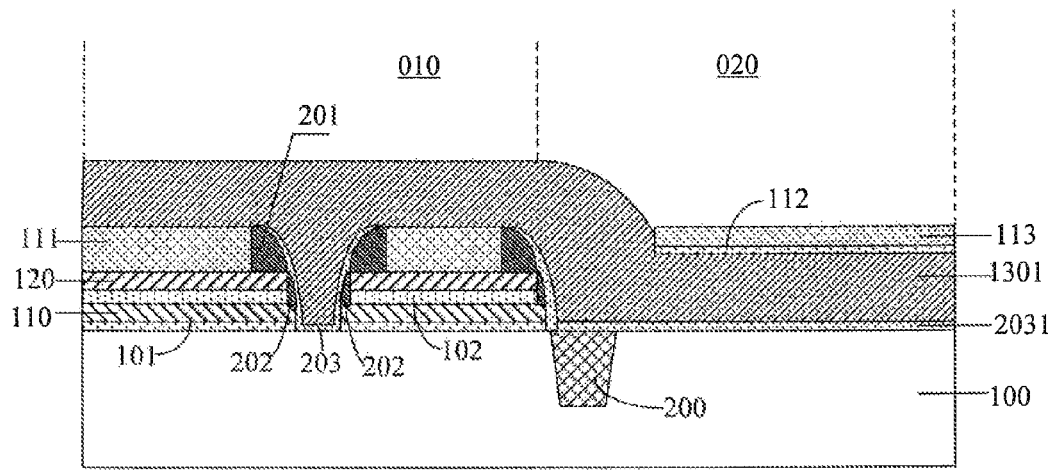
Figure 15:
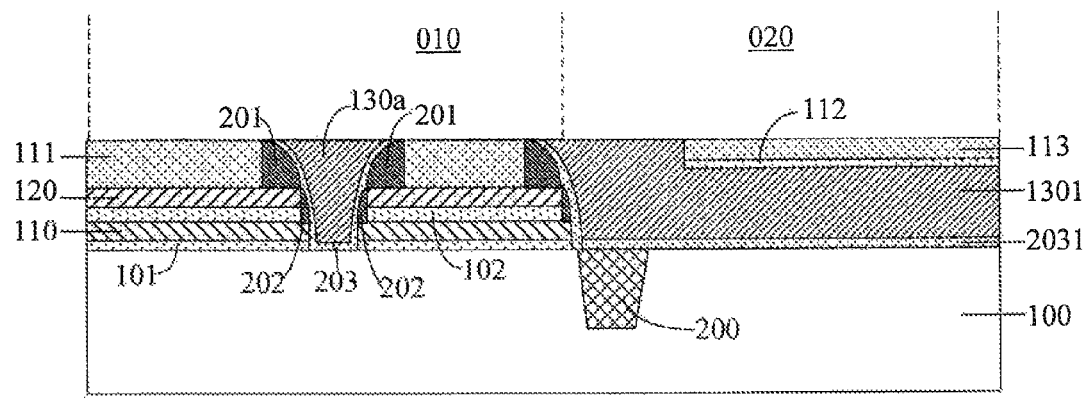

Next, in an ninth step, a portion of each of the third etch stop layer 113, the second etch stop layer 112, the additional conductive layer 1301 and the additional isolation dielectric layer 2031 that covers the first device region 010 is removed, as shown in FIG. 14, followed by a planarization process performed for exposing the first etch stop layer 111, as shown in FIG. 15. The planarization process may include a chemical-mechanical planarization (CMP) process. After this step, a surface of the polished third conductive layer 130a in the first trench 210 may be substantially flush with a surface of the first etch stop layer 111. The third conductive layer 130a may serve as a word line WL for a memory array and may constitute a gate for a memory cell.

Figure 16:
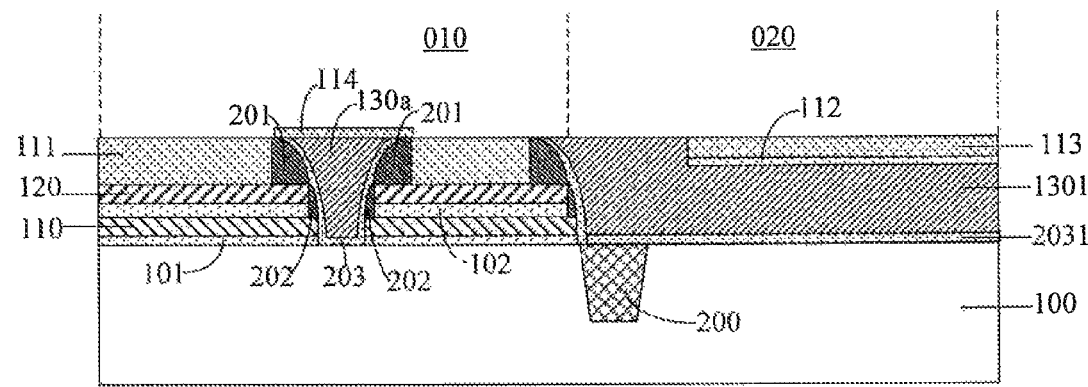
Figure 17:
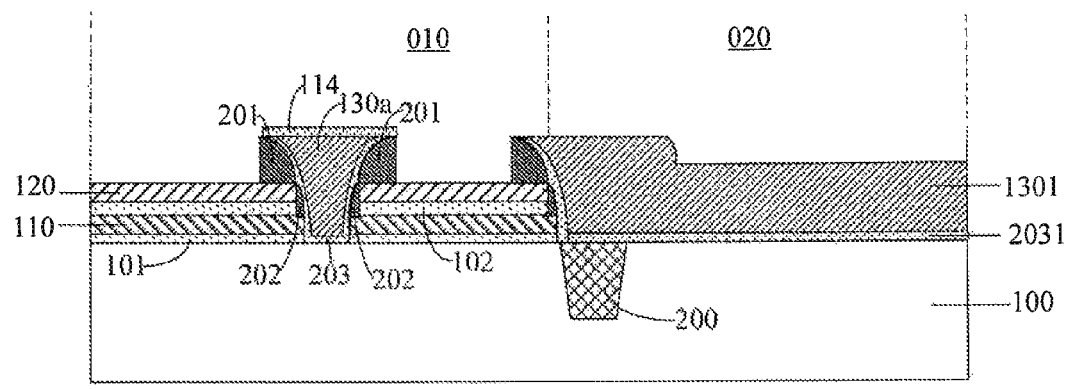

After that, a tenth step is performed which includes: depositing a fourth etch stop layer 114 over a surface of the third conductive layer 130a filled in the first trench 210, as shown in FIG. 16; and removing the first and third etch stop layers 111,113 using the fourth etch stop layer 114 as a mask, as shown in FIG. 17.

With further reference to FIG. 16, the fourth etch stop layer 114 may protect the underlying memory device being fabricated and the word line (namely, the third conductive layer 130a) therein from possible damages during the subsequent processes discussed blow. The fourth etch stop layer 114 may be comprised of silicon dioxide. Turning now to FIG. 17, the first and third etch stop layers 111,113 may be removed by a wet etching process selectively using hot phosphoric acid as an etchant. In the illustrated embodiment, the second etch stop layer 112 is also removed concurrently with the removal of the first and third etch stop layers 111,113.

Figure 18:
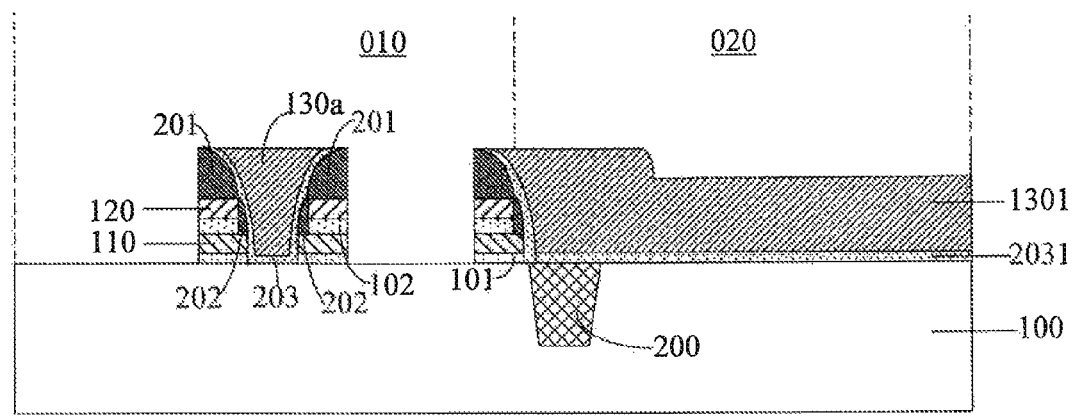

Next, in an eleventh step of the method, an etching process is performed in the first device region 010 using the fourth etch stop layer 114 as a mask until a surface of the semiconductor substrate 100 is exposed. With reference to FIG. 18, in this step, with the fourth etch stop layer 114 as a mask and selectively with a photoresist layer protecting the second device region 020, portions of each of the second conductive layer 120, the second dielectric layer 102, the first conductive layer 110 and the first dielectric layer 101 that cover the first device region 010 are removed in this order using any suitable technique known to those skilled in the art until a surface of the underlying semiconductor substrate 100 is exposed. Remaining portions of the first conductive layer 110 may serve as floating gates FG for a split-gate type flash memory device, and remaining portions of the second conductive layer 120 may serve as control gates CU for the memory device.

After that, in a twelfth step, an electrode for connecting to an external power supply is formed by photolithography patterning.

Figure 19:
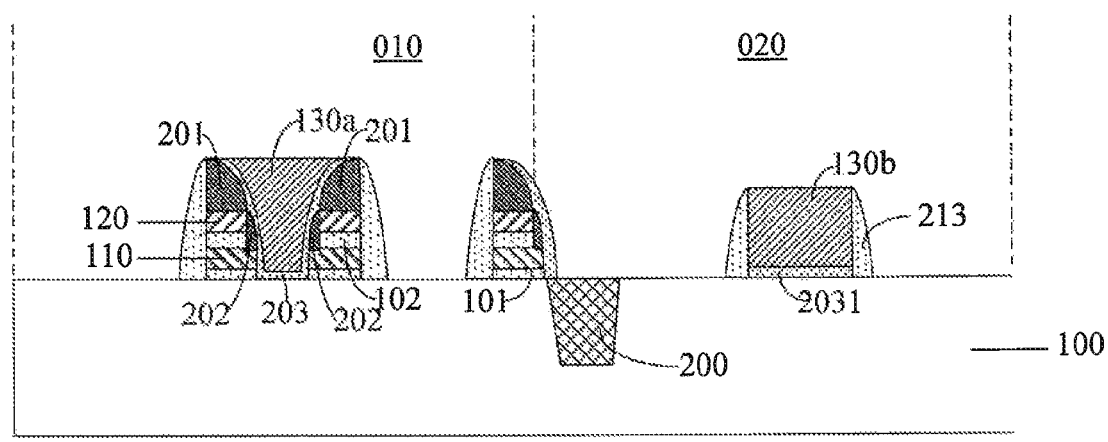

Specifically, as shown in FIG. 19, this step may include: performing photolithography patterning in the second device region 020 according to the designed layout; removing undesirable portions of the additional conductive layer 1301 and undesirable portions of the additional isolation dielectric layer 2031 using any suitable technique known to those skilled in the art to form an electrode 130b for other semiconductor devices on the same substrate to connect to an external power supply.

In addition to the steps described above, the method may further include steps of forming source doped regions and drain doped regions for the memory cell, bit lines BL connecting to the source/drain doped regions, the word line WL, sidewalls laterally covering the gate and common metal connection wires, using respective suitable processes know to those skilled in the art.

FIG. 19 depicts a resulting semiconductor device of the method in accordance with the illustrated embodiment. Wherein, a semiconductor substrate 100 includes a first and second device region 010, 020, separated from each other by an STI structure 200. A memory device is formed in the first device region 010. The memory device is a split-gate type flash memory device, in which each memory cell includes two memory bit cells. Each memory bit cell includes a floating gate FG and a control gate CO located separately above the floating gate FG. The floating gates FG are constituted by portions of the first conductive layer 110 and the control gates CG by portions of the second conductive layer 120. The two memory bit cells co-share a single word line 130a. A tunnel oxide layer (i.e., the third isolation dielectric layer 203) is located above the semiconductor substrate 100 and under both the word line 130a and the floating gates FG (i.e., the portions of the first conductive layer 110). A gate oxide layer (i.e., the first dielectric layer 101) is located between the floating gates FG and the semiconductor substrate 100. An intermediate layer (i.e., the second dielectric layer 102) is located between the floating gates FG and the control gates CG. In the memory bit cells, electric charges are erased by applying a high voltage to the word line 130a and programming activities are performed using hot electron injection.

With continuing reference to FIG. 19, in the second device region 020, sidewalls 213 laterally cover both side faces of an electrode 130b for connecting to other semiconductor devices. The sidewalls 213 may be comprised of silicon oxide or porous silicon dioxide and formed using any suitable process known to those skilled in the art.

In a most preferred embodiment, the first and second dielectric layers 101, 102, the second and fourth etch stop layers 112, 114, the first, second and third isolation sidewalls 201, 202, 203 and the additional isolation dielectric layer 2031 are all comprised of silicon dioxide. Additionally, the first, second and third conductive layers 110, 120, 130 and the additional conductive material 1301 are all comprised of polysilicon. Moreover, both the first and third etch stop layers 111, 113 are comprised of silicon nitride. Separately, thicknesses of the first and second dielectric layers 101, 102, the first and second conductive layer 110, 120, and the first and third etch stop layers 111, 113 are 100 Å, 200 Å, 200 Å, 1000 Å, 4000 Å and 400 Å, respectively. In addition, a width of each of the second and third isolation sidewalls 202, 203 along trench length is 100 Å and a thickness of each third isolation sidewall 203 is 80 Å. In memory bit cells resulting from the method in this embodiment, electric charges are erased in a polysilicon-to-polysilicon manner by applying a high voltage to the word line 130a and programming activities are performed using hot electron injection.

In an alternative embodiment, the first and second dielectric layers 101, 102, the second and fourth etch stop layers 112, 114, the first, second and third isolation sidewalls 201, 202, 203 and the additional isolation dielectric layer 2031 are all comprised of silicon dioxide. Additionally, the first and second conductive layers 110, 120 are both comprised of a nanocrystalline material and the third conductive layer 130 is comprised of a metal. Moreover, both the first and third etch stop layers 111, 113 are comprised of silicon nitride. Separately, thicknesses of the first and second dielectric layers 101, 102, the first and second conductive layer 110, 120, and the first and third etch stop layers 111, 113 are 120 Å, 250 Å, 300 Å, 1200 Å, 4500 Å and 500 Å, respectively. In addition, a width of each of the second and third isolation sidewalls 202, 203 along trench length is 110 Å and a thickness of each third isolation sidewall is 150 Å. In memory bit cells resulting from the method in this embodiment, electric charges are erased by applying a high voltage to the word line 130a and programming activities are performed using hot electron injection.

In a memory device fabricated using the method in accordance with the illustrated embodiment, every two bit cells co-share a single word line 130a, thereby enabling performing programming activities, including reading, erasing and those performed by hot electron injection, to the bit cells by applying different operating voltages to the word line 130a, two control gates (i.e., two portions of the second conductive layers 120) and source/drain regions of the memory device. The co-sharing of the word line 130a enables a split-gate type flash memory device to effectively reduce chip size and eliminate the issue of "over-erasure" while maintaining the existing chip electrical isolation performance. In addition, in the method, the electrode 130b for picking up other semiconductor devices on the same substrate is prepared concurrently with the formation of the word line 130a for a memory array (i.e., the gate G of the memory cell) without damaging or affecting the memory device and other semiconductor structures and without needing any additional processes or increasing process complexity.

Moreover, the method meets the need for the fabrication of a semiconductor device incorporating both a split-gate structure and a MOS transistor which includes gate oxide with a desired thickness.

While the illustrated embodiment shows a method of fabricating a semiconductor device in which a split-gate structure neighbors an MOS transistor, the present disclosure is not so limited. The present invention may also be applicable to the fabrication of a semiconductor device including a split-gate structure and a MOS transistor that do not neighbor each other.

Moreover, while in the illustrated embodiment, a STI structure for improving device and operational performance is preferably formed between the split-gate structure and the MOS transistor, the present disclosure is not so limited. For example, there may be no STI structure formed between the split-gate structure and the MOS transistor.

In addition, those skilled in the art should appreciate that while the present invention has been discussed above with respect to a method of fabricating a memory device, it is not so limited. The present invention may be used in the fabrication of any semiconductor device incorporating the above discussed semiconductor structure (e.g., a structure comprising a memory array and a MOS transistor that includes a desired thickness of gate oxide, or a structure comprising a split-gate structure and a MOS transistor that includes a desired thickness of gate oxide).

Moreover, the semiconductor device and memory device fabrication methods discussed above are particularly suitable for the fabrication of a 90 nm embedded flash memory.

It should be understood that the specific embodiments described and illustrated above are not intended to limit the invention in any way. Those skilled in the art can make various alternatives, modifications and variations without departing from the scope of the invention in light of the foregoing description. Thus, it is intended that the present invention embrace all such alternatives, modifications and variations as fall within the true scope of the appended claims.

What is claimed is:

1. A method of manufacturing a semiconductor device, the semiconductor device comprising a split-gate structure and a metal oxide semiconductor (MOS) transistor, the method comprising the steps of:
   1) providing a semiconductor substrate including a first device region and a second device region;
   2) sequentially forming a first dielectric layer, a first conductive layer, a second dielectric layer, a second conductive layer, and a first etch stop layer over the semiconductor substrate;
   3) forming a first window in the first etch stop layer in the first device region, removing a portion of the first etch stop layer that covers the second device region and forming a first isolation sidewall over each side face of the etched first etch stop layer;
   4) forming a first trench in the first device region by performing an etching process using the first etch stop layer and the first isolation sidewalk as a mask until a surface of the semiconductor substrate is exposed;
   5) depositing a third isolation dielectric layer and a third conductive layer over the resulting structure after the step 4);
   6) removing a portion of each of the third isolation dielectric layer and the third conductive layer that covers the second device region;
   7) sequentially depositing an additional conductive layer and an additional isolation dielectric layer over the resulting structure after the step 6);
   8) sequentially depositing a second etch stop layer and a third etch stop layer over the resulting structure after the step 7);
   9) removing a portion of each of the third etch stop layer, the second etch stop layer, the additional conductive layer and the additional isolation dielectric layer that covers the first device region, followed by a planarization process for exposing the first etch stop layer;
   10) depositing a fourth etch stop layer over a surface of the third conductive layer filled in the first trench and removing the first and third etch stop layers using the fourth etch stop layer as a mask;
   11) performing an etching process in the first device region using the fourth etch stop layer as a mask until a surface of the semiconductor substrate is exposed; and
   12) removing undesirable portions of each of the additional conductive layer and the additional isolation dielectric layer in the second device region to form an electrode for connecting to an external power supply.

2. The method according to claim 1, wherein the third isolation dielectric layer in the first device region has a thickness different from a thickness of the additional isolation dielectric layer in the second device region.

3. The method according to claim 2, wherein the step 2) includes a process of forming a shallow trench isolation (STI) structure, the process including the steps of:
   201) sequentially forming a first dielectric layer, a first conductive layer and an STI etch stop layer over the semiconductor substrate;
   202) forming a second window in the STI etch stop layer and forming an STI trench by sequentially etching, in the second window, the first conductive layer, the first dielectric layer and a portion of the semiconductor substrate;
   203) forming an STI structure by filling an insulating material in the STI trench and removing the STI etch stop layer and undesirable portions of the insulating material; and 204) forming a second dielectric layer, a second conductive layer and a first etch stop layer over the resulting structure after the step 203).

4. The method according to claim 2, wherein the step 4) includes the steps of:
  401) etching the second conductive layer and the second dielectric layer until the first conductive layer is exposed;
  402) forming second isolation sidewalk covering both side faces of the etched second conductive and second dielectric layers; and
  403) etching the first conductive layer and the first dielectric layer until the semiconductor substrate is exposed.

5. The method according to claim 2, wherein the first dielectric layer serves as a gate oxide layer and has a thickness of 50 Å to 200 Å.

6. The method according to claim 4, wherein the second dielectric layer and the second isolation sidewalls are insulating dielectric layers each comprised of one or more dielectric materials selected from the group consisting of silicon dioxide, silicon nitride, silicon oxynitride and silicon oxide containing carbon.

7. The method according to claim 4, wherein the second dielectric layer has a thickness of 50 Å to 350 Å, and wherein each of the second isolation sidewalls has a width of 50 Å to 350 Å in a length direction of the first trench.

8. The method according to claim 2, wherein the third isolation dielectric layer serves as a tunnel oxide layer and is comprised of silicon oxide, silicon nitride or a combination thereof.

9. The method according to claim 2, wherein the third isolation dielectric layer has a width of 50 Å to 200 Å in a length direction of the first trench and a thickness of 80 Å to 150 Å.

10. The method according to claim 2, wherein the first conductive layer is comprised of polysilicon, silicon nitride or an electrically conductive nanocrystalline material; wherein the second conductive layer is comprised of polysilicon or a metal; and wherein the third conductive layer is comprised of polysilicon or a metal.

11. The method according to claim 2, wherein the first and third etch stop layers are comprised of silicon nitride.

12. The method according to claim 2, wherein the first isolation sidewalls and the second and fourth etch stop layers are comprised of silicon dioxide.

13. The method according to claim 2, wherein the third conductive layer in the first trench serves as a gate of a memory cell; and wherein remaining portions of the first conductive layer and remaining portions of the second conductive layer after the step 9) respectively serve as floating gates and control gates of the memory cell.

14. The method according to claim 2, wherein the split-gate structure is formed in the first device region and the MOS transistor is formed in the second device region.

* * * * *